United States Patent
Senn et al.

(10) Patent No.: US 11,385,292 B2
(45) Date of Patent: Jul. 12, 2022

(54) BATTERY MATERIALS SCREENING

(71) Applicant: VOLKSWAGEN AKTIENGESELLSCHAFT, Wolfsburg (DE)

(72) Inventors: Melanie Senn, Mountain View, CA (US); Gianina Alina Negoita, Belmont, CA (US); Nasim Souly, San Mateo, CA (US); Vedran Glavas, Wolfsburg (DE); Julian Wegener, Wolfsburg (DE); Prateek Agrawal, San Jose, CA (US)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 0 days.

(21) Appl. No.: 17/017,588

(22) Filed: Sep. 10, 2020

(65) Prior Publication Data
US 2022/0074994 A1    Mar. 10, 2022

(51) Int. Cl.
*G01R 31/367* (2019.01)
*G01R 31/378* (2019.01)
(Continued)

(52) U.S. Cl.
CPC ......... *G01R 31/367* (2019.01); *G01R 31/378* (2019.01); *G06N 3/0454* (2013.01); *G06N 7/005* (2013.01); *H01M 10/0525* (2013.01)

(58) Field of Classification Search
CPC .. G01R 31/367; G01R 31/378; G06N 3/0454; G06N 7/005; H01M 10/0525
See application file for complete search history.

(56) References Cited

U.S. PATENT DOCUMENTS

| 9,373,059 B1 * | 6/2016 | Heifets | G06T 1/60 |
| 2012/0232685 A1 * | 9/2012 | Wang | G06F 30/23 |
| | | | 700/98 |

(Continued)

FOREIGN PATENT DOCUMENTS

DE    102012203436 A1    9/2012

OTHER PUBLICATIONS

Bhowmik et al., "A Perspective on Inverse Design of Battery Interphases Using Multi-Scale Modelling, Experiments and Generative Deep Learning", Energy Storage Materials, 2019.
(Continued)

*Primary Examiner* — Raymond L Nimox
(74) *Attorney, Agent, or Firm* — Wong & Rees LLP; Kirk D. Wong

(57) ABSTRACT

A method, apparatus, system for batter material screening is disclosed. First, microstructure generation parameters for a plurality of microstructures are received, where the microstructure generation parameters include microstructure characteristics. Microstructure statistics are generated using a first artificial intelligence ("AI") model, where the received microstructure generation parameters are inputs for the first AI model. Microstructure properties are predicted using a second AI model for the microstructures based on the generated microstructure statistics, the received microstructure generation parameters, and battery cell characteristics. It is determined whether at least one of the microstructures is within a predefined energy profile range based on the predicted microstructure properties.

18 Claims, 11 Drawing Sheets

(51) Int. Cl.
*G06N 7/00* (2006.01)
*G06N 3/04* (2006.01)
*H01M 10/0525* (2010.01)

(56) References Cited

U.S. PATENT DOCUMENTS

| | | | | |
|---|---|---|---|---|
| 2019/0278880 | A1* | 9/2019 | Ma | G06N 3/084 |
| 2020/0089826 | A1* | 3/2020 | Liu | B33Y 50/00 |
| 2020/0222010 | A1* | 7/2020 | Howard | G06N 3/084 |
| 2020/0257933 | A1* | 8/2020 | Steingrimsson | B22F 5/04 |
| 2020/0405204 | A1* | 12/2020 | Howard | A61B 5/14546 |
| 2021/0117729 | A1* | 4/2021 | Bharti | G06K 9/6257 |
| 2021/0138249 | A1* | 5/2021 | Howard | G16H 20/30 |

OTHER PUBLICATIONS

Cecen et al., "Material Structure-Property Linkages Using Three-Dimensional Convolution Neural Networks", Acta Materialia, 2018.
Hsu et al., "Microstructure Generation via Generative Adversarial Network for Heterogeneous, Topologically Complex 3D Materials", ARXIV, 2020.
Kalidindi, S.R., "A Bayesian Framework for Materials Knowledge Systems", MRS Communications, 2019.
Kauwe et al., "Data-Driven Studies of Li-Ion-Battery Materials", Jan. 18, 2019.
Kwon et al., "Generation of 3D Brain MRI Using Auto-Encoding Generative Adversarial Networks", ARXIV, 2019.
Min et al., "Machine Learning Assisted Optimization of Electrochemical Properties for Ni-Rich Cathode Materials", Nature Scientific Reports, Oct. 25, 2018.
Sendek et al., "Machine Learning-Assisted Discovery of Solid Li-Ion Conducting Materials", Chemical Materials, 2019.
Setio et al., "Pulmonary Nodule Detection In CT Images: False Positive Reduction Using Multi-View Convolutional Networks", IEEE Transaction on Medical Imaging, 35(5): 1160-1169, 2016.
Singh et al., "Physics-Aware Deep Generative Model for Creating Synthetic Microstructures", NIPS, 2018.
Tan et al., "A Deep Learning-Based Method for the Design of Microstructural Materials", Structural and Multidisciplinary Optimization, 2020.
Wu et al., "Applying Machine Learning to the Design of Materials for Lithium Ion Battery", Master Science Nanotechnology, Sep. 26, 2017.
Yang et al., "Establishing Structure-Property Localization Linkages for Elastic Deformation of Three-Dimensional High Contrast Composites Using Deep Learning Approaches", Acta Materialia, 2019.
Yang et al., "Microstructural Materials Design via Deep Adversarial Learning Methodology", ARXIV, 2019.
Zhou et al., "Learning Atoms for Materials Discovery", PNAS, 2018.
Gaylon-Lombardo et al, "Pores for Thought: Generative Adversarial Networks for Stochastic Reconstruction of 3D Multi-Phase Electrode Microstructures With Periodic Boundaries", arxiv.org, Cornell University Library, 201 Olin Library Cornell University Ithaca, NY 14853, Feb. 17, 2020 (Feb. 17, 2020).
Li et al., "A Deep Adversarial Learning Methodology for Designing Microstructural Material Systems", Proceedings of the ASME 2018 International Design Engineering Technical Conferences & Computers and Information In Engineering Conference, IDETC/CIE 2018, Aug. 26-29, 2018, Quebec City, Canada.
World Intellectual Property Organization, Application No. PCT/EP21/73702, International Search Report dated Dec. 23, 2021.
Yabansu et al., "Application of Gaussian Process Regression Models for Capturing the Evolution of Microstructure Statistics In Aging of Nicle-Based Superalloys", Acta Materialia, Elsevier, Oxford, GB, vol. 178, Jul. 30, 2019 (Jul. 30, 2019), pp. 45-58.

* cited by examiner

BATTERY MATERIALS SCREENING

CROSS-REFERENCE TO RELATED APPLICATIONS

None.

FIELD

The present disclosure relates to methods, apparatuses, and systems for battery material screening and, more particularly, to battery material screening using a data-driven high-throughput screening framework.

BACKGROUND

Rechargeable battery material development has been on the forefront of scientific and commercial research due to the popularity of electric vehicles. However, the nearly infinite number of possible material combinations for each battery component (e.g., cathode, anode, electrolyte, and separator) makes for an unworkable problem for today's researchers. In particular, identification of optimal material combinations require numerous candidates to be slowly evaluated by physical experiments and/or computer simulations. Advances in creating synthetic materials via computer simulations has decreased such effort, but one still needs to focus on a reduced selection of material combinations.

Physical experiments make up the bulk of these intensive efforts in terms of machine and material cost, manual labor, and relatively long execution time. However, simulation environments enable carrying out virtual experiments at less cost and faster speed. These virtual experiments are calibrated from representative real experiments and can thus approximate the experimental behavior considering simplified physical knowledge.

Unfortunately, even with advances in real world experiments and computer simulations backed by billions of dollars of funding, such state of the art design processes are inadequate to fully explore the wide assortment of possible permutations for battery materials. Furthermore, even with sophisticated computer simulations, the compute needed to carry out such simulations can take several minutes to hours, depending on the complexity of the material structure. This would not be feasible when considering the number of permutations of possible candidates.

Therefore, new methods, apparatuses, and systems for battery material screening are desired to speed up development process by using data-driven artificial intelligence (AI) models.

BRIEF DESCRIPTION OF THE FIGURES

The present disclosure is illustrated by way of example and not limitation in the figures of the accompanying drawings, in which like references indicate similar elements and in which.

DETAILED DESCRIPTION OF THE EMBODIMENTS

The figures and descriptions provided herein may have been simplified to illustrate aspects that are relevant for a clear understanding of the herein described devices, systems, and methods, while eliminating, for the purpose of clarity, other aspects that may be found in typical devices, systems, and methods. Those of ordinary skill in the art may recognize that other elements and/or operations may be desirable and/or necessary to implement the devices, systems, and methods described herein. Because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Figure 1A:
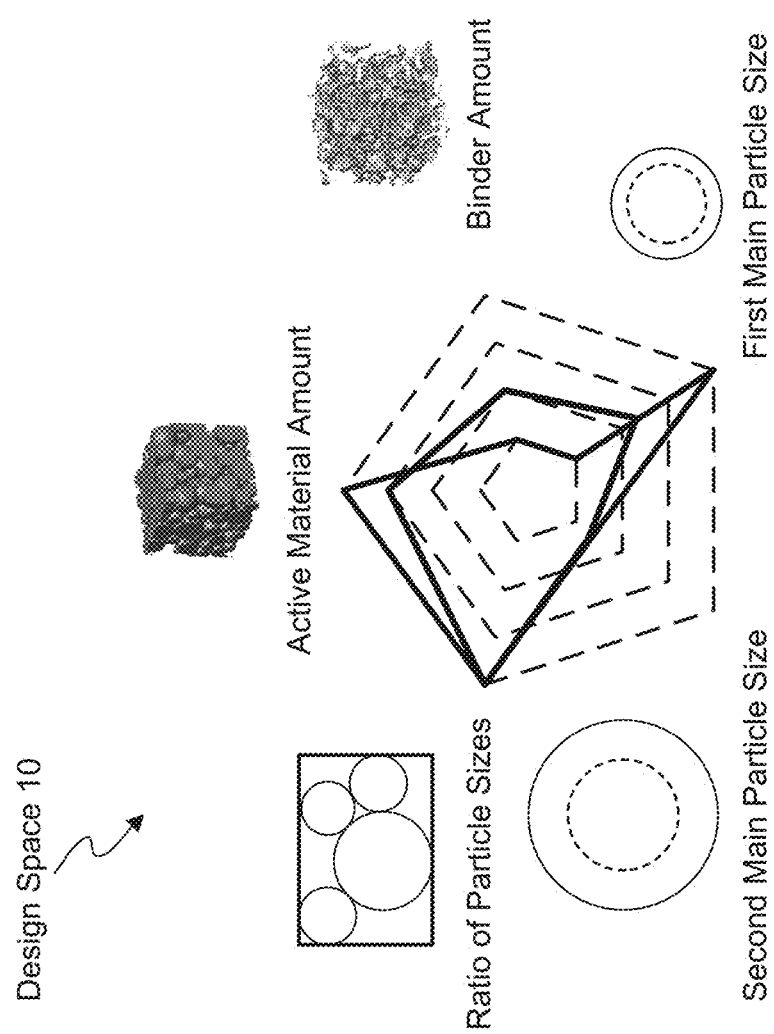
FIG. 1a illustrates a design space for battery material design in accordance with one or more embodiments of the present disclosure.

FIG. 1a illustrates a design space for battery material design of the present disclosure. In developing battery cells (or components therein, including cathodes, anodes, electrolyte, separator, and combinations thereof), multiple design parameters are combined to provide a specific energy and power profile for the battery. For instance, a design space 10 can provide a glimpse of the multivariable analysis made when designing, for example, a cathode material, including determining ratio particle sizes, an active material amount, a binder amount, a first main particle size, and a second main particle size that can be obtained from physical experiments and/or microstructure generation parameters from a simulation perspective. Within this design space, any changes to one of more of these considerations can ultimately affect the energy and power profile of the battery. It is impractical to run a physical experiment or computer simulation for each permutation within the design space 10. Thus, more efficient and practical methods, apparatuses, and systems are needed to provide a battery screening process of the design space 10.

It is appreciated a design space for battery materials is not limited to the considerations in the design space 10. As additional considerations increase the scope of the design space for the battery materials, the difficulty in screening a particular permutation is further exacerbated and ultimately untenable using traditional means of analysis. This further increases the need for new methods, apparatuses, and systems to provide a more efficient means of battery material screening process.

Cell data (e.g., chemical compositions of the particles, composition of the active material, composition of the binder, doping of those compositions, types of doping, and other related factors) can be considered as well in the design space.

The emergence of compute power and evolving deep learning techniques allow for artificial intelligence-based high-throughput screening in the field of materials design. A data-driven high-throughput screening framework is proposed for materials design that allows materials screening for numerous candidates at speeds much faster than by computer simulations (e.g., around or near several milliseconds per prediction). Synthetic microstructure generation and electrochemical modeling are combined while also considering battery cell properties. A simple machine learning model on the averaged microstructure properties for materials screening and a complex deep learning models on the three dimensional (3D) microstructures can enable generative materials design. The model uncertainty can be used to efficiently create new simulation data samples for incremental model improvements. The most promising candidates selected by the materials screening procedures can be validated with computer simulations.

Although such models may have little knowledge about the underlying physical behavior of the battery materials being screened, the models can screen thousands of physical parameter combinations and reveal promising candidates to execute in simulations and/or experiments. Even if the models are not exactly accurate with respect to a specific energy level, the models can provide accurate abstract behavior in terms of trends. Thus, the models can be used to guide the execution on the lower abstraction levels where promising candidates are validated with higher execution effort. The advantages of such approach provided herein is (1) a reduction in time for materials screening and to (2) gain insight into design of optimal materials by AI generated material structures.

Figure 1B:
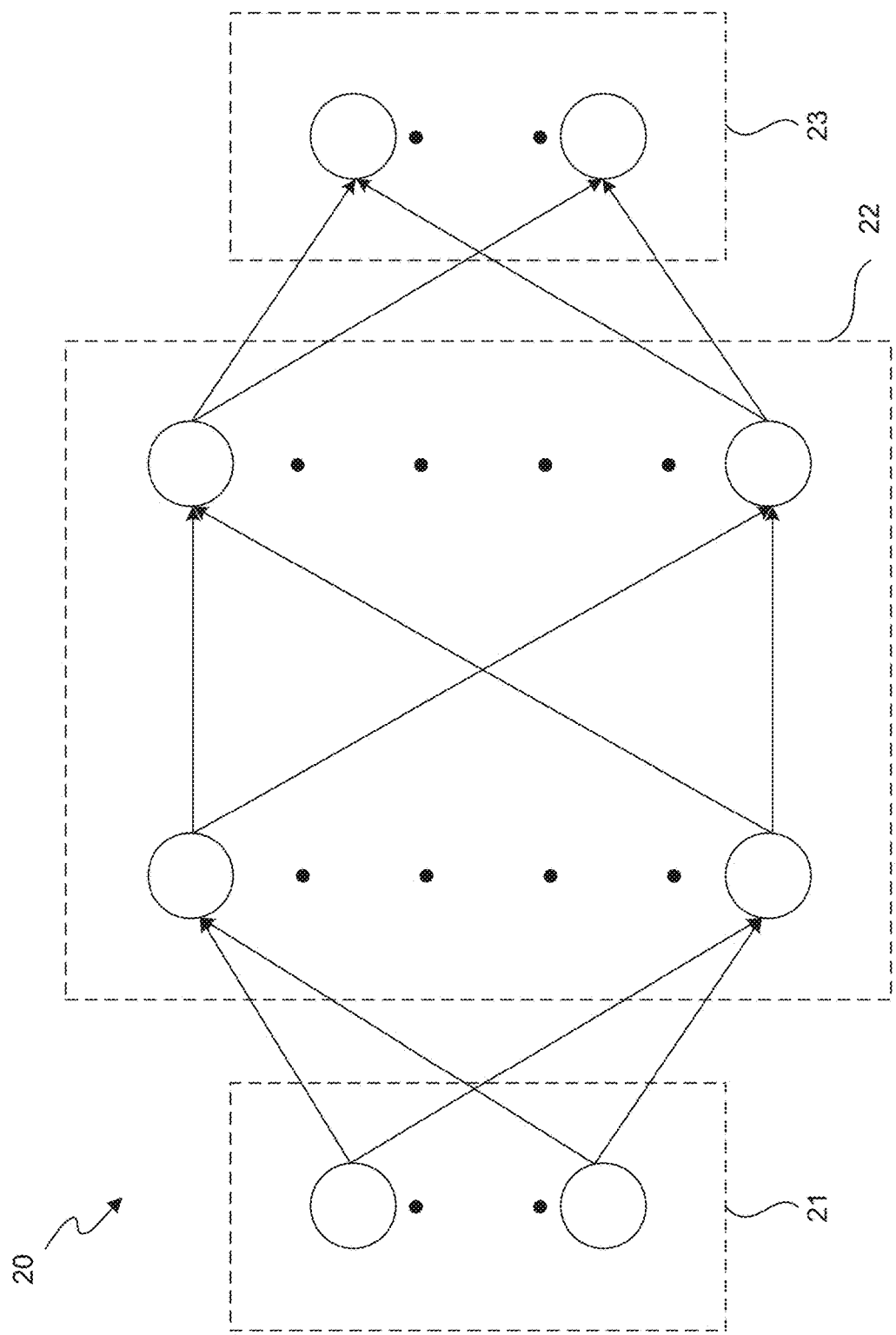
FIG. 1b illustrates a diagram of a simple AI model, in accordance with one or more embodiments of the present disclosure.

FIG. 1b illustrates a diagram illustrating an example of a simple AI model, in accordance with one or more embodiments of the present disclosure. The neural network 20 may be an example of a simple artificial intelligence model (also referred to as a simple neural network). The neural network 20 may be used to model relationships between various inputs and outputs or to find patterns in data, where the dependency between the inputs and the outputs may not be easily ascertained. The neural network 20 may also be a computing model that may be used to determine a feature in input data through various computations. For example, the neural network 20 may determine a feature (e.g., a number, shape, pattern, etc.) in input data (e.g., audio data, image data, video data, cell microstructures, etc.) according to a structure that defines a sequence of computations to be performed. The neural network 20 may also generate an output (e.g., an inference, a decision, etc.) based on the input data. For example, the neural network 20 may generate/determine a bounding box around an object in an image/video, may generate/determine a path/trajectory for a vehicle, or may provide predicted power and energy provide for particular battery materials.

The neural network 20 may be a feed forward neural network without temporal feedback, i.e. where the connections between the nodes do not form a cycle (e.g., connections do not go backwards). The signals, messages, data, information etc., may not go backwards through the neural network (e.g., may not go from right to left). The neural network 20 includes an input layer 21, a hidden layer 22, and an output layer 23. Each of the input layer 21, the hidden layer 22, and the output layer 23 includes one or more nodes. Each of the input layer 21, the hidden layer 22, and the output layer 23 may have a different number of nodes. Each of the input layer 21, the hidden layer 22, and the output layer 23 may include multiple layers. For example, the hidden layer 22 may include two, ten, or some other appropriate number of layers. The hidden layer 22 may also be referred to as an intermediate layer or intermediate layers.

Each connection may be associated with a weight or weight value (e.g., may have a weight). A weight or weight value may define coefficients applied to the computations. For example, the weights or weight values may be scaling factors between two or more nodes. Each node may represent a summation of its inputs, and the weight or weight value associated with a connection may represent a coefficient or a scaling factor multiplied to an output of a node in that connection. The weights between the nodes may be determined, calculated, generated, assigned, learned, etc., during a training process for the neural network. For example, the neural network 20 may be trained using training data. Thus, the weights of the hidden layers can be considered as an encoding of meaningful patterns in the data. The weights of the connections between the nodes may be modified by training.

Although the neural network 20 is depicted with a particular number of nodes, layers, and connections, various neural network architectures/configurations may be used in other embodiments. For example, different fully connected neural networks and partially connected neural networks (e.g., where all nodes in adjacent layers are not connected) may be used. In addition, some layer may be fully connected (e.g., the output layer 23 may be a fully connected layer that includes multiple layers of nodes and the layers of nodes may be fully connected). Furthermore, other types of neural networks may also be used. For example, a recurrent neural network (RNN) may be used. A RNN may be a neural network that includes temporal context, i.e. allows connections between nodes to form a cycle and/or may go in a backwards direction.

Figure 1C:
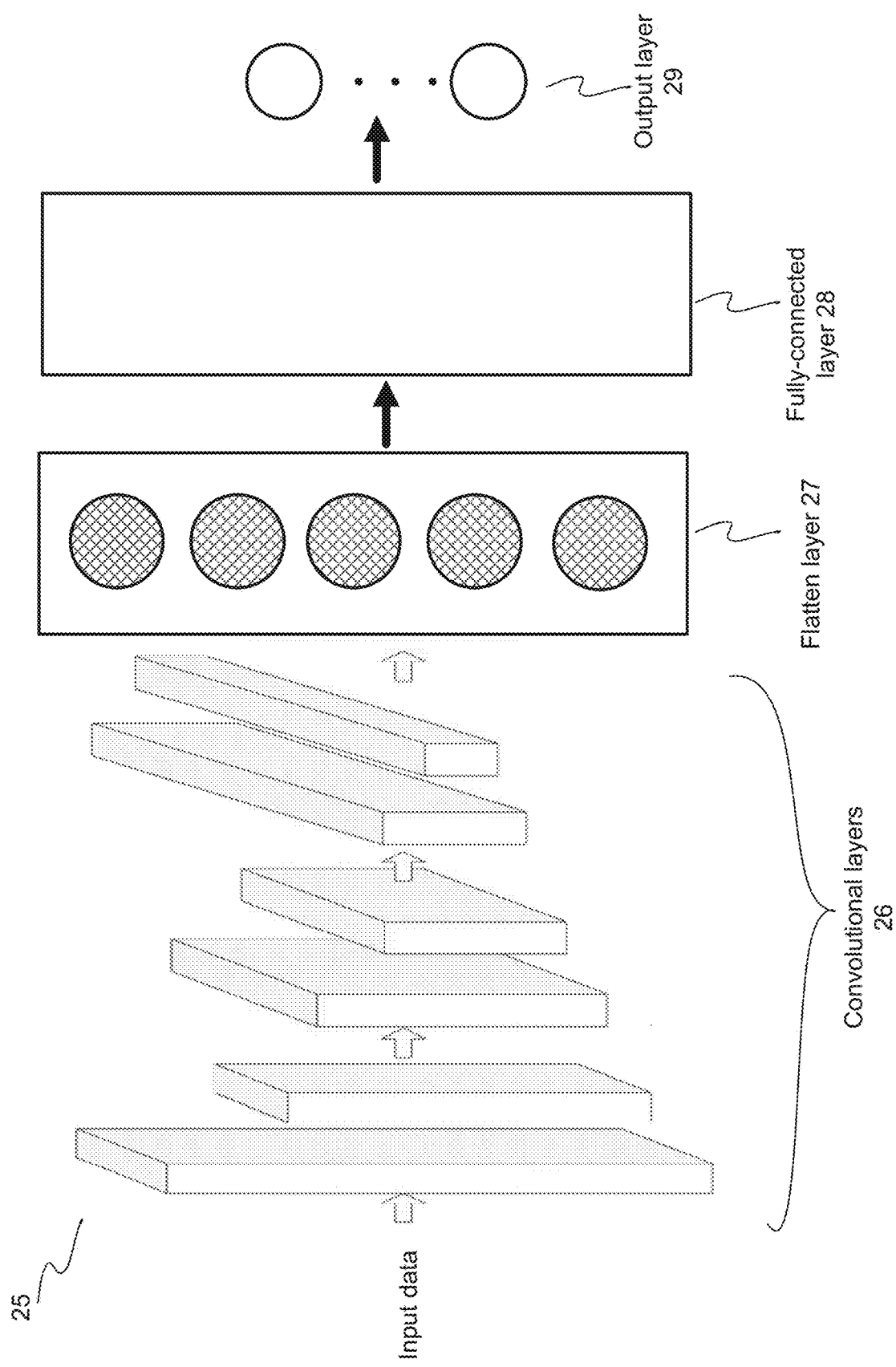
FIG. 1c illustrates a diagram of a complex AI model, in accordance with one or more embodiments of the present disclosure.

FIG. 1c illustrates a diagram illustrating an example of a complex AI model 25, in accordance with one or more embodiments of the present disclosure. The complex AI model 25 can be a convolutional neural network (CNN), comprising convolutional layers 26, a flatten layer 27, fully-connected layer 28, and an output layer 29. The inputs data is inputted to the convolutional layers 26 for feature extraction. From there, the flatten layer 27 and fully-connected layer 28 apply regression to classify the extracted features. The output layer 29 provides classifications or regression values based on the output of the fully-connected layer 28. The convolutional layers 26 can have one or more convolutional layers as appropriate. The fully-connected layer 28 can have one or layers as appropriate as well.

In another embodiment, the complex AI model 25 may be a deep neural network (DNN). A neural network may be deep if a hidden layer includes multiple levels (e.g., multiple sub-layers of nodes). Each of the nodes in a layer is connected to another node in the neural network 25.

Figure 2:
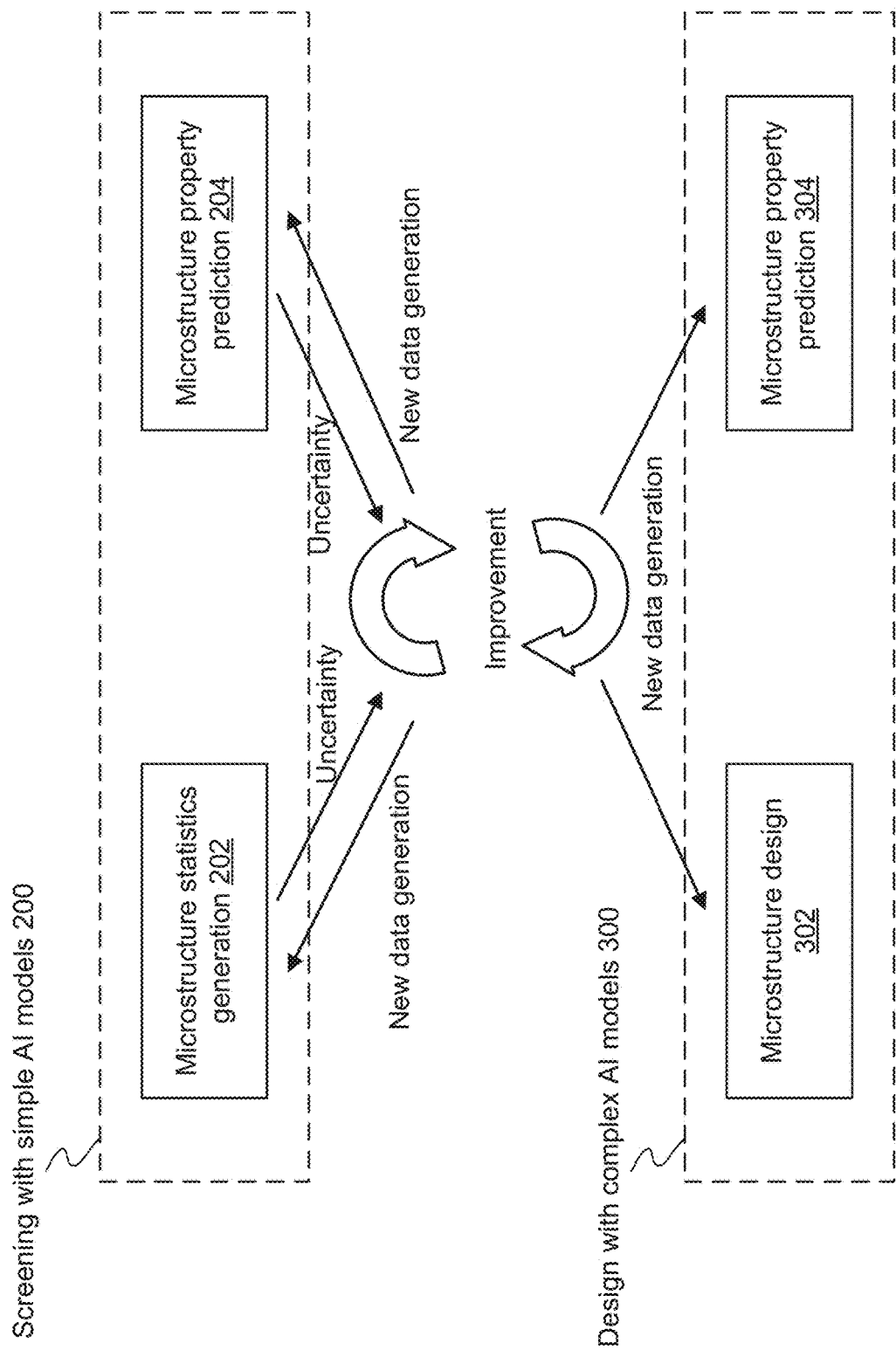
FIG. 2 illustrates a diagram for battery material screening using simple AI models and battery generative material design using complex AI models, in accordance with one or more embodiments of the present disclosure.

FIG. 2 illustrates a diagram for battery material screening 200 using simple AI models and battery generative material design using complex AI models 300, in accordance with one or more embodiments of the present disclosure. For the battery material screening 200, a microstructure statistics generation block 202 is implemented using a simple AI model and a microstructure property prediction block 204 is implemented using a simple AI model. The microstructure property prediction block 204 can receive new generated data and provide an uncertainty for retraining other related AI models. The microstructure statistics generation block 202 can also receive new generated data and provide an uncertainty for retraining other related AI models.

For battery material design 300, a microstructure design block 302 is implemented using a complex AI model and a microstructure property prediction block 304 is implemented using a complex AI model. The microstructure property prediction block 304 can receive new generated data for retraining. The microstructure design block 302 can also receive new generated data for retraining.

Accordingly, simple AI models can be used for screening (e.g. optimize average particle size) and the complex AI models can be used for design (e.g. optimize each particle's size and location). As such, the simple and complex AI models for microstructure property prediction can be independent from each other in this embodiment. However, new generated data samples by the simple AI models (in battery material screening 200) based on their uncertainty can be used to improve the complex AI models (in battery material design 300) via retraining. The complex AI models can be used for generative design (e.g. generative adversarial networks, variational autoencoders, etc.) to identify optimal microstructures (e.g., individual particle sizes, shapes and locations).

Figure 3:
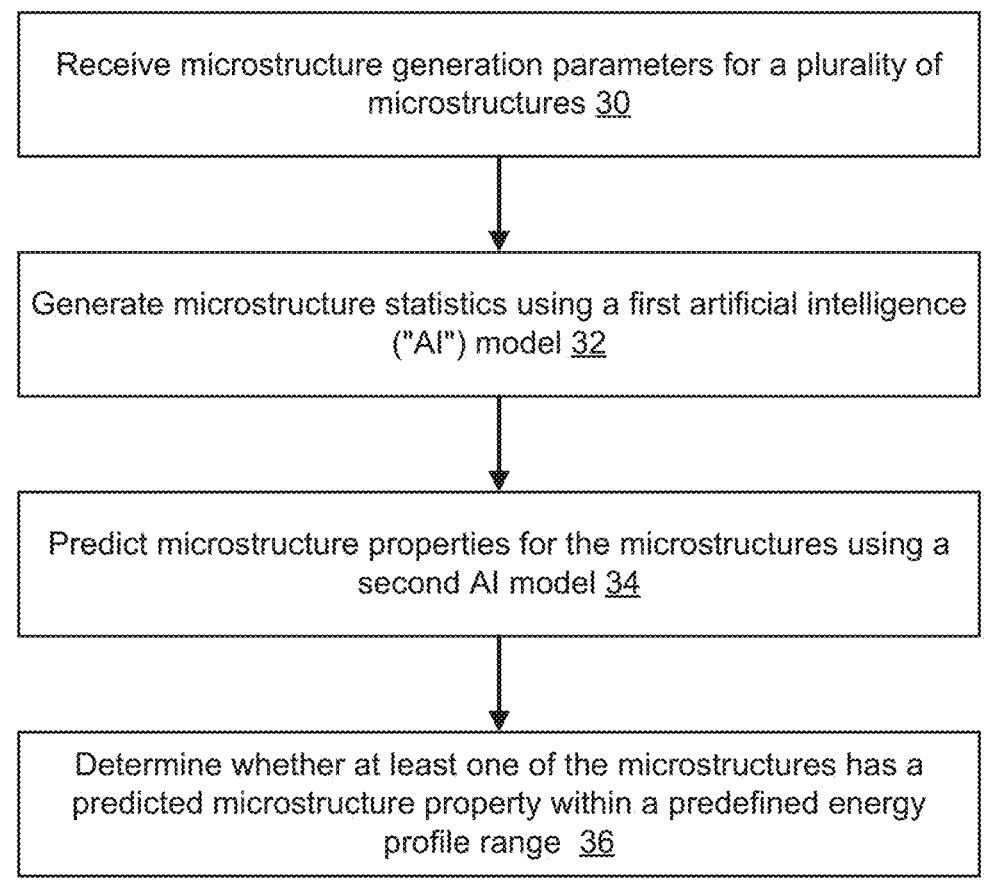
FIG. 3 illustrates a flow chart for screening battery materials in accordance with one or more embodiments of the present disclosure.

FIG. 3 illustrates a flow chart for screening battery materials in accordance with one or more embodiments of the present disclosure. Microstructure generation parameters are received for a plurality of microstructures 30. The microstructure generation parameters include microstructure characteristics (e.g., a first main particle diameter mean, a second main particle diameter mean, a first main scaling factor, a second main scaling factor, a particle diameter standard deviation for a first main particles, a particle diameter standard deviation for a second main particle, a solid volume percentage, a binder weight percentage, a binder contact angle, a binder anisotropy factor, a random seed, and combinations thereof).

The received microstructure generation parameters are inputted to a first simple artificial intelligence model to generate the microstructure statistics 32. The microstructure statistics can include active surface area, effective diffusivity, conductivity of electrolyte, volume fraction of active material, volume fraction of binder material, volume fraction of electrolyte, and combinations thereof.

The first simple AI model can be a feed-forward neural network (FFNN), Gaussian process regression, etc. The first simple AI model is trained by comparing model predictions resulting from randomly initialized model parameters (i.e. connection weights for neural networks) with ground truth labels from simulation data. The objective is to minimize the error between prediction and ground truth by adjusting the model parameters. In case of layered structures such as neural networks, connection weights of each layer are adjusted by pushing the error contribution from the back of the network to the front (referred to as backpropagation) such that all layers get a chance to update their weights.

In an embodiment, the predicted microstructure statistics include active surface area, effective diffusivity, conductivity of electrolyte, and volume fractions for active material, binder and electrolyte. They depend on the distribution of two particle configurations (including mean, standard deviation, and scale factor), solid volume percentage, binder weight percentage, contact angle and anisotropy factor. A random seed (as a one-hot encoded value for 6 different instances) can be included as an input to the microstructure statistics generation approximator to capture its influence. However, the optimal material candidates should be independent of the random seed, so they will be finally validated for all random seeds with simulations, and their variance can be analyzed.

The generated microstructure statistics are inputted to a second simple AI model to predict the microstructure properties 34. The second simple AI model can be a machine learning model, a simple neural network, or other type of simple AI model. The second simple AI model is trained with the same method of error minimization as the first simple AI model. Since this is a more complicated process in case of deep learning models, it might take more time and additional techniques might need to applied (e.g. avoid vanishing/exploding gradients by using certain activation functions or layer normalizations etc.) to obtain a good approximation. The predicted microstructure properties can include a specific power, a specific energy, discharge curves, and combinations thereof.

The battery cell characteristics can be common for both microstructure property prediction models (simple and complex) and can include a cathode thickness, initial Lithium-ion (Li+) concentration of the electrolyte, applied charge rate (C-rate), diffusion coefficient of the active material, and combinations thereof. In addition to the cell characteristics, the complex models make use of the full 3D microstructure, while the simple models include the microstructure characteristics and statistics; these comprise of two different particle configurations (e.g., a mean, standard deviation, and scale factor), active surface area, effective diffusivity, conductivity of the electrolyte and volume fraction for active material, binder and electrolyte. The data can be randomly split on the microstructure level into training and validation data. The same split is used for a better comparison of the different methods for microstructure property prediction.

Next, it is determined whether at least one of the microstructures has a predicted microstructure property that is within a predefined energy and/or power profile range 36. The predefined energy profile range can be defined by the needs of the battery application. For instance for a battery in an electric vehicle, the automotive battery may require a capacity between 90 kWh and 120 kWh, high power output, and ability to be recharged 750 times.

Figure 4:
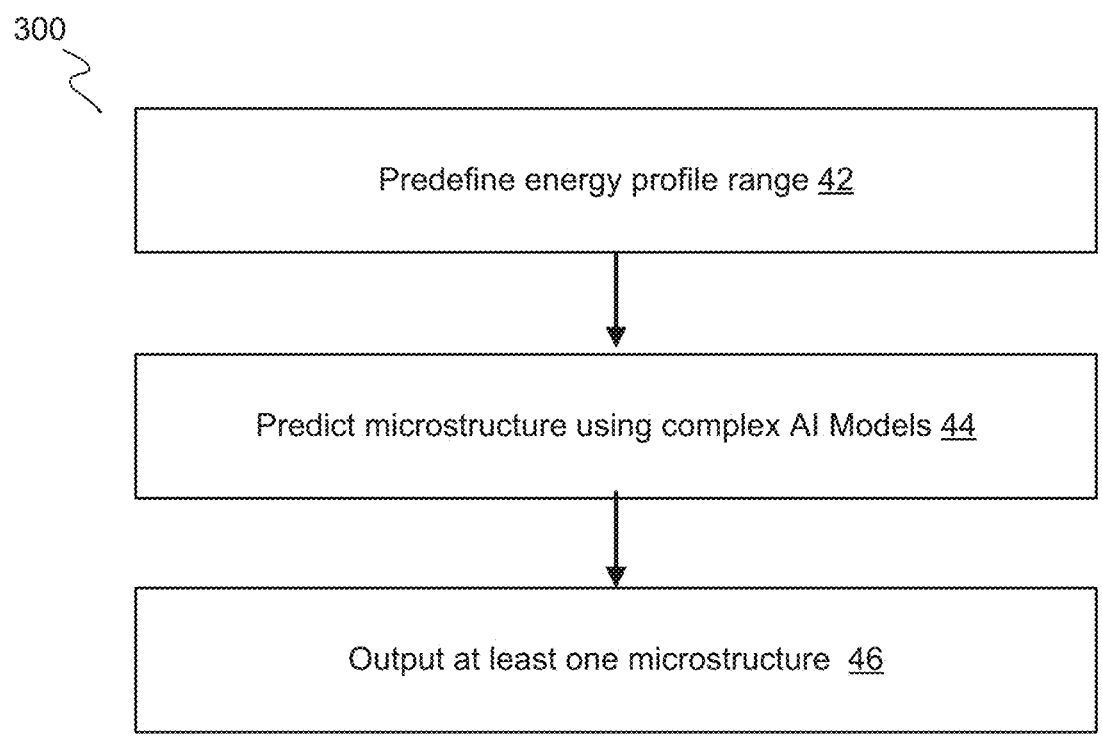
FIG. 4 illustrates a flow chart for generating battery material designs using complex AI models, in accordance with another one or more embodiments of the present disclosure.

FIG. 4 illustrates a flow chart for generating battery material designs using complex AI models, in accordance with one or more embodiments of the present disclosure. With complex AI models, battery materials design can be performed. The inputs for a generative design model can be predefined energy profile range or requirements with respect to energy and/or power 42. With a generative AI design models, the optimal size and location of each particle and binder components from desired energy and/or power profiles can be predicted 44. At least one microstructure with voxels for each element such as particles, electrolyte and binder can be outputted 46.

Training generative models are more complex and involve reconstruction of high-dimensional ground truth data. Generative design can be realized by generative adversarial networks (GANs) or variation autoencoders (VAEs). GANs contain a generative and a discriminative part which are trained incrementally together using error minimization techniques (same as training feed-forward neural networks and convolutional neural networks).

Figure 5:
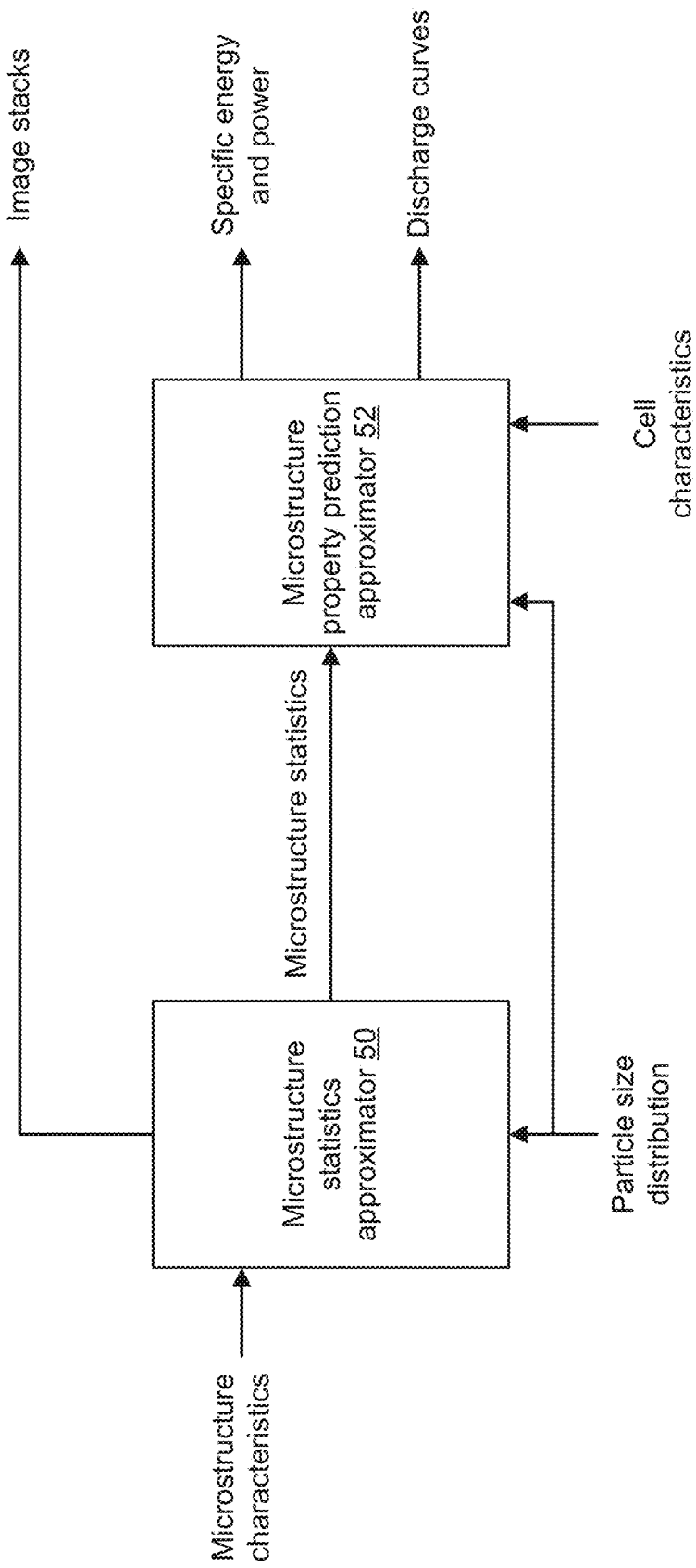
FIG. 5 illustrates a block diagram for screening battery materials in accordance with one or more embodiments of the present disclosure.

FIG. 5 illustrates a block diagram for screening battery materials in accordance with one or more embodiments of the present disclosure. In screening battery materials of the present disclosure, approximations from two AI models (i.e., a model for microstructure statistics generation and a model for microstructure property prediction) are combined to explore both spaces efficiently in a continuous manner.

A computing device can be adapted to provide means for screening battery material designs via a microstructure statistics approximator 50 and a microstructure property prediction approximator 52. The microstructure characteristics and particle size distribution for an electrode (e.g., an anode or cathode) are input to the microstructure statistics approximator 50. The microstructure statistics approximator 50 can be implemented by a simple AI model, and can output microstructure statistics to the microstructure property prediction approximator 52. A microstructure generative model can output image stacks for later use in materials design. Image stacks are 3D microstructure presentations cut into 2D image slices along a z-coordinate for storage and processing. The other image coordinates (i.e., x- and y-coordinates) contain values for either particle active material or binder. For simplification, electrolyte can be assumed to be void. However, it can be appreciated that in another embodiment, the electrolyte can be assigned a value as well in accordance with the present disclosure.

Thus in microstructure statistics generation, the microstructure statistics generation model is fed with microstructure generation parameters such as particle size distribution and percentage of individual material combinations (e.g., solid volume particles and binder). The outputs by the microstructure statistics approximator 50 are homogenized over the entire microstructure as a 3D volume. The microstructure statistics are needed for the microstructure property model when both spaces are explored continuously at the same time in materials screening when corresponding microstructure statistics are not available in discrete data samples.

The microstructure property prediction approximator 52 receives the microstructure statistics, the particle size distribution, and cell characteristics as input to generate specific energy and power information and discharge curves (collectively referred to as an energy profile).

In microstructure property prediction, simple and complex models for microstructure property prediction can be present. For instance, the inputs of the simple AI models are microstructure statistics and battery cell characteristics. The complex models make use of the 3D microstructures as input in addition to the battery cell characteristics; while the simple models are used to screen millions of material combinations to identify a list of optimal candidates. Additionally, the complex models can be incrementally improved for high-dimensional use cases. These include application to experimental data (like SEM images) or generative design with optimization of individual microstructure particle sizes, shapes and locations.

Simple AI models can be used for property prediction from microstructure statistics. Examples of simple AI models are feed-forward neural networks. FFNNs are shallow nonlinear regression networks. In addition to the input and output layers that are dependent on the specific regression task, FFNNs include one or multiple hidden layers in between to model the non-linear relationship between input and output. Each of the neurons of the following layer is connected with each of the neurons of the previous layer. The connections are associated with weights that represent the influence of the connection on the neurons. In each neuron, the sum of inputs multiplied by associated connection weights is calculated, before a nonlinear activation function is applied in the hidden layers. In the output layer, typically a linear activation function is applied. The output is then compared with the ground truth data and the resulting error is pushed back through the network to adjust the connection weights accordingly (backpropagation), such that the output matches the ground truth. A generalized approximation is desired that works on unseen test data and does not simply over fit to the training data. There are several known methods to avoid overfitting.

In an embodiment, FFNNs can be implemented with a Keras framework in Python. The selected FFNN has three hidden layers with 32, 64, 32 neurons each. An adam optimizer with mean square error (MSE) loss, a learning rate of 0.001, a batch size of 128 and dropout factor of 0.1 in the hidden layers are used for better generalization. In addition, early stopping can be applied to avoid overfitting. The input and output data is both transformed using min-max-normalization. In contrary to the typical linear activation function in the output layer, we use relu activations for the microstructure statistics approximator model to make sure that the output is always positive (physical constraints on output parameters). The data can randomly split into 80% training and 20% validation data. Other percentage splits can be used as appropriate.

Another example of simple AI models is a Gaussian process regression. Gaussian process regression (GPR) is a probabilistic learning method that utilizes a stochastic process known as a Gaussian process to create a surrogate model. A Gaussian process is a distribution of a function, parameterized by a mean function and a covariance function, or kernel. The mean function can represent prior knowledge about the function. The kernel function measures the similarity between data points, which is used to quantify uncertainty bounds on predictions on unseen data points in addition to the predictions themselves. Given that the function to be modeled by GPR is an objective function, such uncertainty information for a given prediction is useful for efficiently exploring the design space. Model selection is typically used to select between different kernel functions, such as the squared exponential and rational quadratic functions. The hyper-parameters of the covariance function are tuned by using optimization methods for maximizing the log likelihood of the training data.

In an embodiment, a rational quadratic kernel function can be used, optimizing over the constant scaling factor, length-scale, and white noise level using a limited-memory BFGS (LBFGS) algorithm to maximize the log likelihood. As the log likelihood function has multiple local maxima, a number of optimizer restarts is set to 15. The input data is transformed using min-max normalization, while standardization is applied to the output data. The data can be randomly split into 70% training and 30% validation data; other percentage splits can be used as appropriate.

An example of a complex AI model for property prediction of a high-dimensional microstructure is a convolutional neural network. A CNN is a class of deep learning methods that have become dominant in various computer vision tasks and is attracting interest across a variety of domains, including material design. Leveraging on the rapid growth in the amount of the annotated data and the great improvements in the strengths of graphics processor units (GPUs), the research on convolutional neural networks has increased greatly and become more applicable to high dimensional battery design. Traditionally, a CNN is composed of multiple building blocks, such as convolution layers, pooling layers, and fully connected layers, and is designed to automatically and adaptively learn spatial hierarchies of features from two-dimensional (2D) images with three color channels through a backpropagation algorithm. Different features are extracted through convolution using filters whose weights are automatically learned during training and all these extracted features are then combined to make decisions. A loss function measures the compatibility between output predictions of the network through forward propagation and given ground truth labels. A commonly used loss function for multiclass classification can be cross-entropy. In an embodiment of the present disclosure, a mean-squared error and a mean-absolute error are used for regression of continuous values.

CNNs can also be applied to three-dimensional (3D) images. For example, they are frequently used for the classification of lung nodules on computed tomography (CT) images as benign or malignant. Because 2D images are frequently utilized in computer vision, deep learning networks developed for 2D images (2D-CNN) are not directly applied to 3D images. To apply deep learning to 3D images, different approaches such as custom architectures are used. For example, a multi-stream CNN can be used to classify nodule candidates of chest CT images between nodules or non-nodules from a lung image database. The nodule candidates are extracted from differently oriented 2D image patches based on multi-planar reconstruction from one nodule candidate. These patches were used in separate streams and merged in the fully connected layers to obtain the final classification output.

In an embodiment of the present disclosure, a 3D-CNN and 2D-CNN in combination with long short-term memory (LSTM) for fully capturing the 3D spatial context information of a microstructure can be used; both methods are described in further detail below.

3D convolutions are generalization of 2D convolutions. 2D convolutions encode spatial relationships of objects in 2D space, while 3D convolutions describe the spatial relationships of objects in 3D space. Such 3D relationship is important for some applications, such as in 3D segmentations/reconstructions of biomedical imagining, e.g. CT and MRI where objects such as blood vessels meander around in the 3D space. In 3D convolutions, the 3D filter can move in all 3-directions of data (height, width and depth of the image) and produce 3D activation maps. At each position, the element-wise multiplication and addition is performed. Since the filter slides through a 3D space, the output is 3D data.

A 3D activation map, produced during the convolution of a 3D CNN, can be necessary for analyzing data where temporal or volumetric context is important. The ability to analyze a series of frames or images in context can lead to the use of 3D CNNs as tools in many domains: action recognition, evaluation of medical imaging, evaluation of material properties, etc.

In an embodiment of the present disclosure, 3D convolutions are applied for the evaluation of material properties, such as specific energy and power. The input consists of microstructures and cell characteristics. Each microstructure can comprise a stack of 256 images of size (256, 256, 3) each; where "256" represents dimensions of the 3D volume (i.e., height, width, and length) and "3" represents the channels (e.g., RGB values for images or, in this case, microstructure components, including particle, binder, and electrolyte). Therefore, each microstructure can be viewed as a data volume of (256, 256, 256, 3), where three represents the channels number for each image. There can be four cell characteristics.

The goal is to build a model that fuses these two different types of data in order to obtain the specific energy and power. In an example, the CNN can be composed of two 3D convolutions layers, followed by an average pooling later, three fully-connected layers, and a regression layer. Dropout is used as regularization to prevent overfitting.

The first two layers are convolutional and encode each microstructure stack of images into a feature vector. The first convolution is composed of 32 filters and the second convolution is composed of 64 filters. Both convolutions use filters of size 9 and stride 5. The convolution layers are followed by an average pooling layer of length 2 to reduce the spatial dimension. Then, a fully connected layer with 512 nodes interprets the features learned by the 3D convolution layers. The cell characteristics are fused with features extracted from microstructure data through a hard attention mechanism after the first fully connected layer. The element-wise product is found to be one of the most effective strategies for feature fusion. The cell characteristics are repeated and multiplied element-wise with the feature vector from images. Afterwards, another two fully-connected layers (256, and 128 nodes, respectively) are used to learn their combined features. Finally, an output layer with two nodes directly predicts a vector with two outputs: energy and power, respectively. Dropout layers with 50% rate are added after each layer to prevent overfitting.

The dataset can be split into two sets: a training dataset and a validation dataset. Eighty percent (80%) of the data can be used for training and 20% of the data can be used for validation. The split is a random split at the microstructure level after shuffling the dataset. Other percentages can be used as appropriate for other splits. Normalization of the inputs and standardization of the outputs are performed to increase the model's performance. Relu activation functions are used for each layer. The loss function is mean square error and the optimizer is Adagrad with learning rate of 0.001. Error metrics used herein include root mean squared error (RMSE), mean absolute error (MAE) and relative error. Performance of the model is summarized using a single score such as taken the average of RMSE, MAE and Relative Error across all the predictions. An R2 score can also be reported as well.

For both approximation models for (1) microstructure statistics generation and (2) microstructure property prediction, the prediction sampling space can be analyzed by uncertainty of GPR. This enables efficient generation of new data samples with the simulation tools. A variety of candidates is screened by their uncertainty: only the most difficult cases (with high uncertainty) are sent for execution, while the simple cases (with low uncertainty) are skipped. The upper and lower limits for model input parameters are determined from the simulation data. Then, different screening studies are created by variation of combinations of input parameters. The input parameter space is discretized in equidistant steps with individual steps sizes for each input parameter. All candidates of the multiple screening studies are ranked by their uncertainty and the top (most uncertain) N=1000 candidates are selected for execution in the simulation tools.

The incremental model improvement workflow starts from the initial simulation data set. First, models are trained and evaluated by their uncertainty. The difficult candidates are run with the simulation tools and the models are retrained for improvement based on the incremental data. Then, the retrained models are again evaluated by their uncertainty. This iterative improvement is continued until the uncertainty does not improve (decrease) significantly any more.

Figure 6:
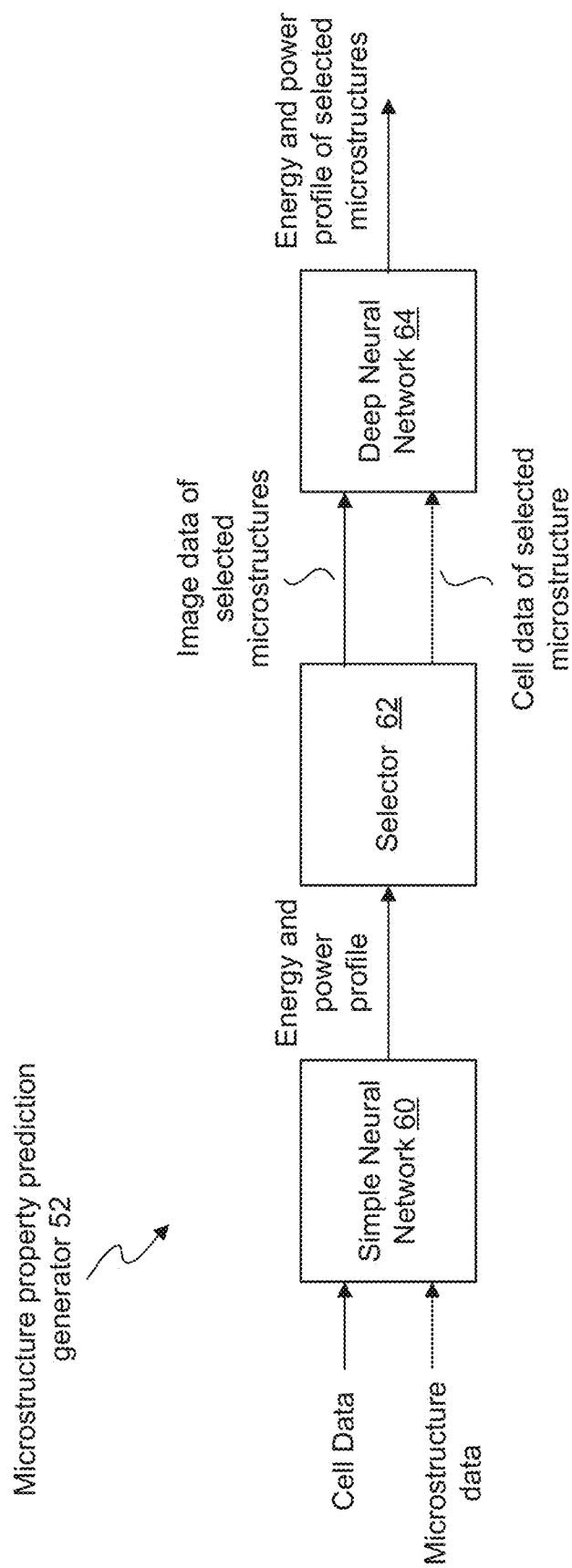
FIG. 6 illustrates a process flow for a microstructure property prediction approximator in accordance with one or more embodiments of the present disclosure.

FIG. 6 illustrates a process flow for a microstructure property prediction approximator in accordance with one or more embodiments of the present disclosure. The microstructure property prediction approximator 52 comprises a simple neural network 60, a selector 62 for optimal microstructures, and a deep neural network 64. The cell data and microstructure data for the microstructure candidates can be inputted to the simple neural network 60. The simple neural network can output energy and power profiles of those microstructure candidates for screening by the selector 62. The selector 62 can find the microstructure candidates that are near or within a predefined energy profile range.

Those selected microstructure candidates can be further evaluated by a deep neural network (DNN) 64. The image data and the cell data for the selected microstructure candidates are inputted to the DNN 64. The DNN 64 outputs a predicted energy and power profile for the selected microstructures.

Figure 7:
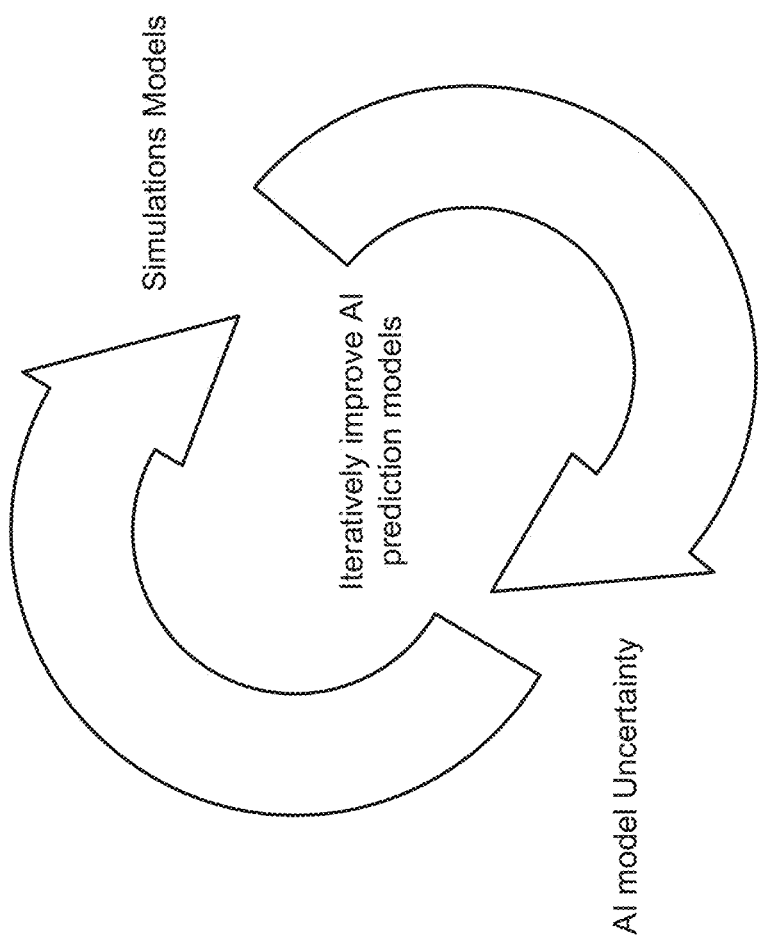
FIG. 7 illustrates a process flow for iteratively improving AI prediction models in accordance with one or more embodiments of the present disclosure.

FIG. 7 illustrates a process flow for iteratively improving AI prediction models in accordance with one or more embodiments of the present disclosure. The AI models described herein can be iteratively improved by passing AI model uncertainty and data for validation by simulation models. The results of the simulation models can then be used to retrain the AI prediction models. This iterative process can be repeated a predefined number of times (e.g., 2) or until uncertainty of the AI predictions models are below a predefined threshold value.

Figure 8:
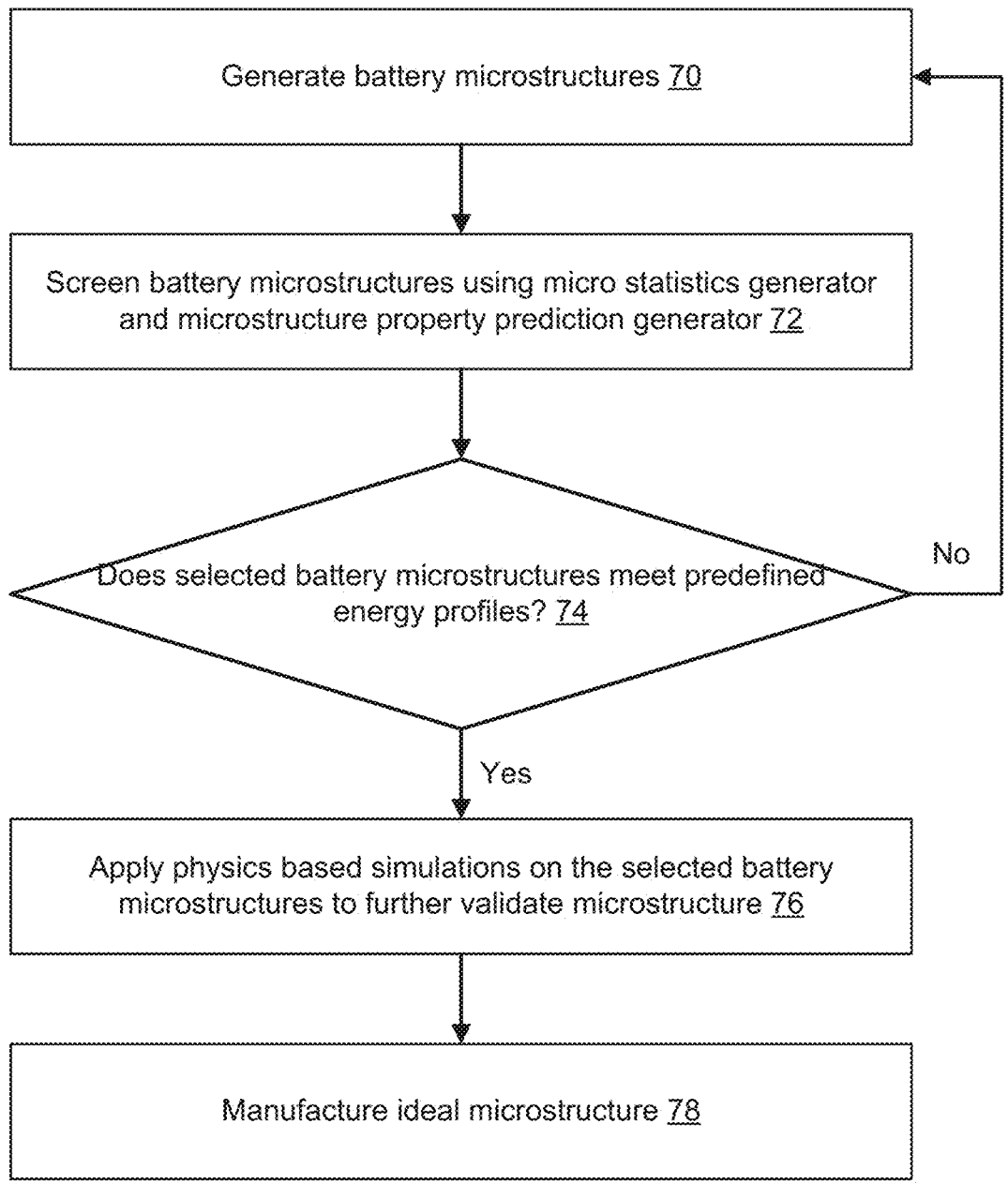
FIG. 8 illustrates a flow chart for iterative battery material design process in accordance with one or more embodiments of the present disclosure.

FIG. 8 illustrates a flow chart for iterative battery material design process in accordance with one or more embodiments of the present disclosure. The overall manufacturing flow for a battery can be as follows. First, battery microstructures are generated for potential use in a battery design 70. The battery microstructures are screened by a microstructure statistics approximator and a microstructure property prediction approximator 72.

An iterative process can be undertaken by determining whether the selected battery microstructures meet defined energy profiles 74. If not, then the entire microstructure candidates can be omitted and a new microstructure can be proposed until one or more microstructure are found. If one or more of the selected microstructures does satisfy the energy profile range, then the next step can be to apply physics based simulations on the selected battery microstructures to validate the predicted energy profile and/or to further screen until one best candidate is found 76. Once the ideal microstructure is found, that microstructure is manufactured 78.

In an embodiment for materials screening, for both approximation models for (1) microstructure statistics generation and (2) microstructure property prediction, the materials design space is explored as discussed above. The most promising candidates can be identified with priority queues and Bayesian optimization. The chosen candidates are then validated by simulation runs and analyzed in more detail.

In particular, for a design of experiments, existing model input parameters are identified from simulation data for each of the two prediction spaces. A full factorial design (e.g., Cartesian product) is created from all possible input parameter combinations. For each parameter combination, microstructure statistics are generated and microstructure properties are predicted with feed forward neural networks. Thus, millions of candidates can be screened, and the promising candidates selected from that original list of material combinations. The selection is implemented with priority queues which are data structures that contain an array most promising candidates sorted by their priority.

For Bayesian optimization (BO), BO is a method for global optimization of black box functions using Gaussian processes. Given an unknown objective function, BO creates a surrogate model for the objective and quantifies the uncertainty using GPR, which infers probability distributions of the true objective function. From this, an acquisition function is calculated to determine where to sample the next point within the surrogate model. As such, the acquisition function dictates the search strategy, and contains certain parameters that allows the user to explore the exploitation versus exploration trade-off to determine the optimal point. Acquisition functions can be used for lower confidence bound, probability of improvement, and expected improvement. The acquisition functions take into account the uncertainties of objective value, which are then typically used to sample the next point such as to reduce the uncertainty. Because acquisition functions can help explore and exploit the search space more efficiently than other methods, Bayesian optimization is particularly used to optimize functions that may be expensive to evaluate.

Figure 9:
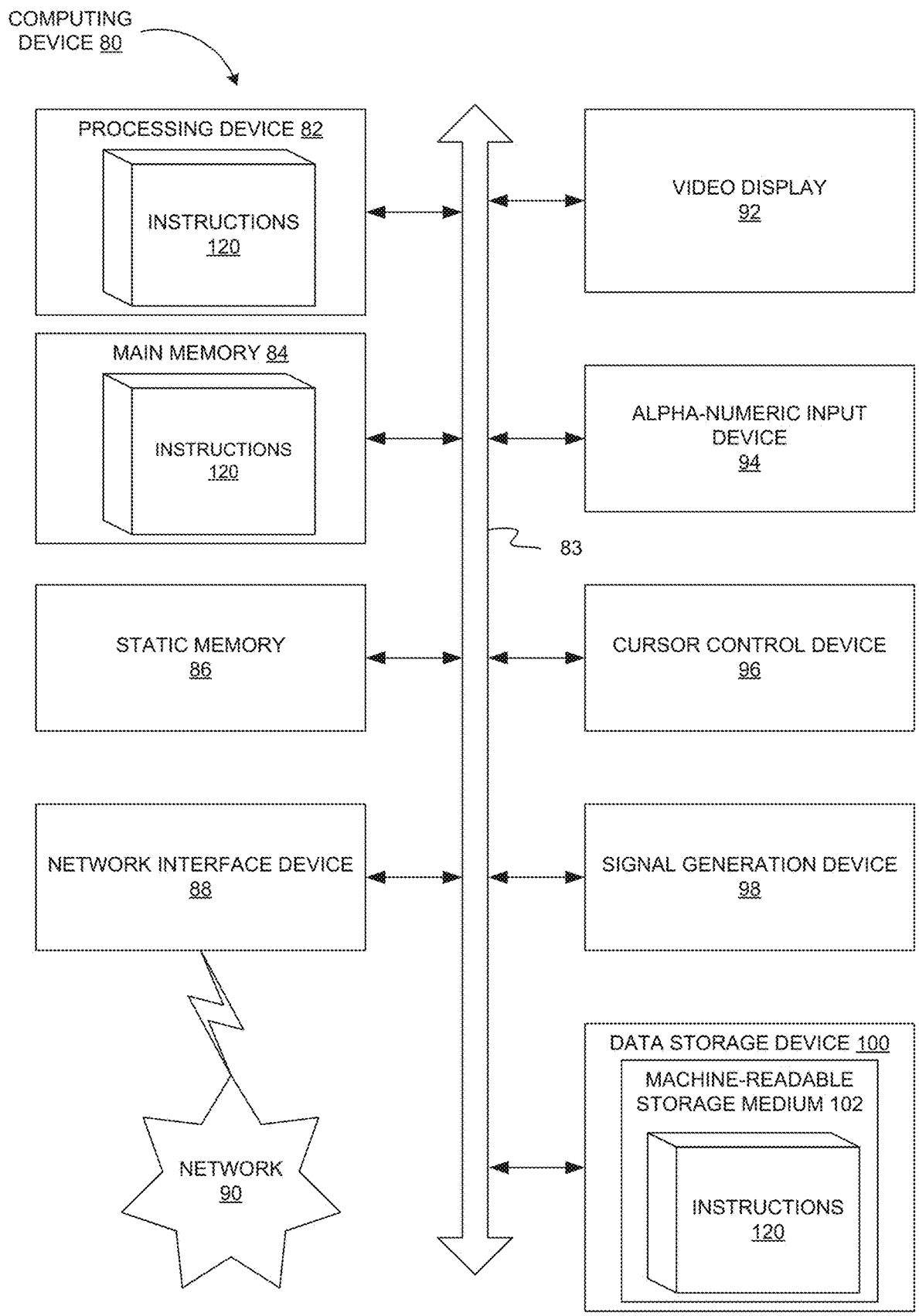
FIG. 9 illustrates a block diagram of an example computing device that may perform one or more of the operations described herein, in accordance with some embodiments of the present disclosure.

FIG. 9 is a block diagram of an example computing device that may perform one or more of the operations described herein, in accordance with some embodiments of the present disclosure. Computing device 80 may be connected to other computing devices in a LAN, an intranet, an extranet, and/or the Internet. The computing device may operate in the capacity of a server machine in client-server network environment or in the capacity of a client in a peer-to-peer network environment. The computing device may be provided by a personal computer (PC), a set-top box (STB), a server, a network router, switch or bridge, or any machine capable of executing a set of instructions (sequential or otherwise) that specify actions to be taken by that machine. Further, while only a single computing device is illustrated, the term "computing device" shall also be taken to include any collection of computing devices that individually or jointly execute a set (or multiple sets) of instructions to perform the methods discussed herein.

The example computing device 80 may include a processing device (e.g., a general purpose processor, a PLD, etc.) 82, a main memory 84 (e.g., synchronous dynamic random access memory (DRAM), read-only memory (ROM)), a static memory 86 (e.g., flash memory and a data storage device 818), which may communicate with each other via a bus 83.

Processing device 82 may be provided by one or more general-purpose processing devices such as a microprocessor, central processing unit, or the like. In an illustrative example, processing device 82 may comprise a complex instruction set computing (CISC) microprocessor, reduced instruction set computing (RISC) microprocessor, very long instruction word (VLIW) microprocessor, or a processor implementing other instruction sets or processors implementing a combination of instruction sets. Processing device 82 may also comprise one or more special-purpose processing devices such as an application specific integrated circuit (ASIC), a field programmable gate array (FPGA), a digital signal processor (DSP), network processor, or the like. The processing device 802 may be configured to execute the operations described herein, in accordance with one or more aspects of the present disclosure, for performing the operations and steps discussed herein.

Computing device 80 may further include a network interface device 88 which may communicate with a network 90. The computing device 80 also may include a video display unit 92 (e.g., a liquid crystal display (LCD) or a cathode ray tube (CRT)), an alphanumeric input device 94 (e.g., a keyboard), a cursor control device 96 (e.g., a mouse) and an acoustic signal generation device 98 (e.g., a speaker). In one embodiment, video display unit 92, alphanumeric input device 94, and cursor control device 96 may be combined into a single component or device (e.g., an LCD touch screen).

Data storage device 100 may include a computer-readable storage medium 102 on which may be stored one or more sets of instructions, e.g., instructions for carrying out the operations described herein, in accordance with one or more aspects of the present disclosure. Instructions 120 implementing the different systems, modules, components, etc., described herein (e.g., battery material screening, illustrated in FIG. 3, battery material design, illustrated in FIG. 4, the micro statistics approximator and microstructure property prediction approximator, illustrated in FIG. 5.) may also reside, completely or at least partially, within main memory 84 and/or within processing device 82 during execution thereof by computing device 80, main memory 84 and processing device 82 also constituting computer-readable media. The instructions may further be transmitted or received over a network 90 via network interface device 88.

While computer-readable storage medium 102 is shown in an illustrative example to be a single medium, the term "computer-readable storage medium" should be taken to include a single medium or multiple media (e.g., a centralized or distributed database and/or associated caches and servers) that store the one or more sets of instructions. The term "computer-readable storage medium" shall also be taken to include any medium that is capable of storing, encoding or carrying a set of instructions for execution by the machine and that cause the machine to perform the methods described herein. The term "computer-readable storage medium" shall accordingly be taken to include, but not be limited to, solid-state memories, optical media and magnetic media.

In an embodiment, a cloud computing system can be used to implement the computing device 80 and/or the data storage device 100. The cloud computing system can be communicatively coupled to a computing device to provide the storage and/or processing power to perform the methods described herein. For instance, in an exemplary embodiment, simulation models are run on an internal compute clusters. The AI models can be trained on the internal compute clusters (e.g., with multiple graphical processing units in parallel) or using cloud computing with machine parallelizing over multiple central processing unit cores and graphical processing units.

Unless specifically stated otherwise, terms such as "storing," "receiving, "determining," "transmitting," "training," "obtaining," "generating," "retrieving", "selecting" or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

Examples described herein also relate to an apparatus for performing the operations described herein. This apparatus may be specially constructed for the required purposes, or it may comprise a general purpose computing device selectively programmed by a computer program stored in the computing device. Such a computer program may be stored in a non-transitory computer-readable storage medium.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing. In addition, other operations may be performed between two operations that are illustrated/described.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

We claim:

1. A computing device, comprising:
   at least one memory configured to store computer program instructions; and
   at least one processing device operatively coupled to the at least one memory, the at least one processing device configured to execute the computer program instructions to:
   receive microstructure generation parameters for a plurality of microstructures, where the microstructure generation parameters include microstructure characteristics;
   generate microstructure statistics using a first artificial intelligence ("AI") model, where the received microstructure generation parameters are inputs for the first AI model;
   predict microstructure properties using a second AI model for the microstructures based on the generated microstructure statistics, the received microstructure generation parameters, and battery cell characteristics; and
   determine whether at least one of the microstructures is within a predefined energy profile range based on the predicted microstructure properties;
   validate the at least one of the microstructures by computer simulation, where results of the validated microstructure are used to retrain the second AI model.

2. The computing device of claim 1, wherein the first AI model is a feed-forward neural network or a Gaussian process regression.

3. The computing device of claim 1, wherein the second AI model is a feed-forward neural network or a Gaussian process regression.

4. The computing device of claim 1, wherein the microstructure generation parameters include particle size distribution.

5. The computing device of claim 1, wherein the microstructure characteristics include a first main particle diameter mean, a second main particle diameter mean, a first main scaling factor, a second main scaling factor, a particle diameter standard deviation for a first main particles, a particle diameter standard deviation for a second main particle, a solid volume percentage, a binder weight percentage, a binder contact angle, a binder anisotropy factor, a random seed, and combinations thereof.

6. The computing device of claim 1, wherein the battery cell characteristics include a cathode thickness, a Lithium-ion (Li+) concentration, an applied charge rate (C-rate), a diffusion coefficient of the active material, and combinations thereof.

7. The computing device of claim 1, wherein the generated microstructure statistics include an active surface area, an effective diffusivity, a conductivity of an electrolyte, a volume fraction of an active material, a volume fraction of a binder material, a volume fraction of the electrolyte, and combinations thereof.

8. The computing device of claim 1, wherein the predicted microstructure properties include a specific power, a specific energy, discharge curves, and combinations thereof.

9. The computing device of claim 1, further comprising the computer program instructions:
   define an energy profile range;
   predict at least one microstructure using at least one complex AI model; and
   output the predicted microstructure,
   wherein the at least one complex AI model is retrained using uncertainty and new data generation from the second AI model.

10. The computing device of claim 9, wherein the at least one complex AI model is a selected one from a group of a convolutional neural network, a deep neural network, a generative adversarial network, and a variation autoencoder.

11. The computing device of claim 1, wherein in the predict microstructure properties computer program instruction, further comprises the sub-instructions of:
   predict energy profiles for the microstructures using the second AI model, wherein the second AI model is a simple neural network;
   select microstructure candidates from the microstructures based on the predicted energy profiles; and
   predict energy profiles for the selected microstructure candidates using a deep neural network.

12. A computer-implemented method for battery material screening, comprising:
   receiving microstructure generation parameters for a plurality of microstructures, where the microstructure generation parameters include microstructure characteristics;
   generating microstructure statistics using a first artificial intelligence ("AI") model, where the received microstructure generation parameters are inputs for the first AI model;
   predicting microstructure properties using a second AI model for the microstructures based on the generated microstructure statistics, the received microstructure generation parameters, and battery cell characteristics; and determining whether at least one of the microstructures is within a predefined energy profile range based on the predicted microstructure properties;

validating the at least one of the microstructures by computer simulation, wherein results of the validated microstructure are used to retrain the second AI model.

13. The computer-implemented method of claim 12, wherein the first AI model is a feed-forward neural network or a Gaussian process regression, and wherein the second AI model is a feed-forward neural network or a Gaussian process regression.

14. The computer-implemented method of claim 13, wherein the microstructure generation parameters include particle size distribution, wherein the microstructure characteristics include a first main particle diameter mean, a second main particle diameter mean, a first main scaling factor, a second main scaling factor, a particle diameter standard deviation for a first main particles, a particle diameter standard deviation for a second main particle, a solid volume percentage, a binder weight percentage, a binder contact angle, a binder anisotropy factor, a random seed, and combinations thereof, wherein the battery cell characteristics include a cathode thickness, a Lithium-ion (Li+) concentration, an applied charge rate (C-rate), a diffusion coefficient of the active material, and combinations thereof, wherein the generated microstructure statistics include an active surface area, an effective diffusivity, a conductivity of an electrolyte, a volume fraction of an active material, a volume fraction of a binder material, a volume fraction of the electrolyte, and combinations thereof, and wherein the predicted microstructure properties include a specific power, a specific energy, discharge curves, and combinations thereof.

15. The computer-implemented method of claim 13, further comprising the steps of:

defining an energy profile range;

predicting at least one microstructure using at least one complex AI model; and outputting the predicted microstructure, wherein the at least one complex AI model is retrained using uncertainty and new data generation from the second AI model.

16. A non-transitory computer readable medium encoded with instructions that when executed by at least one processor causes the processor to carry out the following operations:

receive microstructure generation parameters for a plurality of microstructures, where the microstructure generation parameters include microstructure characteristics;

generate microstructure statistics using a first artificial intelligence ("AI") model, where the received microstructure generation parameters are inputs for the first AI model;

predict microstructure properties using a second AI model for the microstructures based on the generated microstructure statistics, the received microstructure generation parameters, and battery cell characteristics; and determine whether at least one of the microstructures is within a predefined energy profile range based on the predicted microstructure properties;

validate the at least one of the microstructures by computer simulation, wherein results of the validated microstructure are used to retrain the second AI model.

17. The non-transitory computer readable medium of claim 16, wherein the first AI model is a feed-forward neural network or a Gaussian process regression, wherein the second AI model is a feed-forward neural network or a Gaussian process regression, wherein the microstructure generation parameters include particle size distribution, wherein the microstructure characteristics include a first main particle diameter mean, a second main particle diameter mean, a first main scaling factor, a second main scaling factor, a particle diameter standard deviation for a first main particles, a particle diameter standard deviation for a second main particle, a solid volume percentage, a binder weight percentage, a binder contact angle, a binder anisotropy factor, a random seed, and combinations thereof, wherein the battery cell characteristics include a cathode thickness, a Lithium-ion (Li+) concentration, an applied charge rate (C-rate), a diffusion coefficient of the active material, and combinations thereof, wherein the generated microstructure statistics include an active surface area, an effective diffusivity, a conductivity of an electrolyte, a volume fraction of an active material, a volume fraction of a binder material, a volume fraction of the electrolyte, and combinations thereof, and wherein the predicted microstructure properties include a specific power, a specific energy, discharge curves, and combinations thereof.

18. The non-transitory computer readable medium of claim 17, further comprising the operations of:

define an energy profile range;

predict at least one microstructure using at least one complex AI model; and output the predicted microstructure, wherein the at least one complex AI model is retrained using uncertainty and new data generation from the second AI model.

* * * * *